(12) United States Patent
Liu et al.

(10) Patent No.: US 11,557,615 B2
(45) Date of Patent: Jan. 17, 2023

(54) DISPLAY SUBSTRATE, MANUFACTURING METHOD THEREOF, DISPLAY PANEL, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Li Liu, Beijing (CN); Quan Liu, Beijing (CN); Jian Teng, Beijing (CN); Minghui Wang, Beijing (CN); Xing Xiong, Beijing (CN); Qinya Cao, Beijing (CN); Yun Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 25 days.

(21) Appl. No.: 17/359,616

(22) Filed: Jun. 27, 2021

(65) Prior Publication Data
US 2022/0149084 A1    May 12, 2022

(30) Foreign Application Priority Data
Nov. 10, 2020  (CN) .......................... 202011249588.6

(51) Int. Cl.
*H01L 27/12*    (2006.01)
*H01L 27/32*    (2006.01)
(Continued)

(52) U.S. Cl.
CPC ...... *H01L 27/1262* (2013.01); *H01L 27/1218* (2013.01); *H01L 51/0097* (2013.01); *H01L 21/31138* (2013.01); *H01L 27/3258* (2013.01); *H01L 51/56* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 11,239,277 B2* | 2/2022 | Lu | .......................... H01L 27/156 |
| 2015/0263235 A1* | 9/2015 | Shin | .......................... H01L 33/38 |
| | | | 257/72 |

(Continued)

*Primary Examiner* — Mohsen Ahmadi
(74) *Attorney, Agent, or Firm* — IPro, PLLC (57) ABSTRACT

A method of manufacturing a display substrate which includes a central display area and an arc-shaped stretch area located at a corner of the central display area, wherein the method includes: preparing a substrate to be etched, which includes a flexible substrate, a stack structure disposed on the flexible substrate, and a last-dry-etched metal layer disposed on a side of the stack structure away from the flexible substrate, the stack structure including an active layer, at least one conductive layer, and a plurality of insulating layers, wherein the last-dry-etched metal layer is a last metal layer that is formed through dry etching; and forming a stretch groove by patterning the substrate to be etched, wherein the stretch groove is disposed in the stretch area and passes through the stack structure and a part of the flexible substrate. A display substrate, a display panel and a display device are further provided.

13 Claims, 9 Drawing Sheets

(51) Int. Cl.
*H01L 21/311* (2006.01)
*H01L 51/00* (2006.01)
*G09F 9/30* (2006.01)
*G09F 9/33* (2006.01)
*H01L 51/56* (2006.01)

(56) References Cited

U.S. PATENT DOCUMENTS

| | | | |
|---|---|---|---|
| 2016/0233280 A1* | 8/2016 | Cheng | H01L 27/3258 |
| 2017/0090227 A1* | 3/2017 | Yun | G02F 1/136286 |
| 2019/0237531 A1* | 8/2019 | Chen | H01L 27/3276 |
| 2019/0305235 A1* | 10/2019 | Hsieh | H01L 51/0097 |
| 2020/0310577 A1* | 10/2020 | Jeon | H01L 51/0096 |
| 2020/0335575 A1* | 10/2020 | Dong | H01L 24/13 |
| 2021/0202676 A1* | 7/2021 | Jeong | G09G 3/3266 |
| 2021/0202907 A1* | 7/2021 | Lee | H01L 27/3276 |
| 2022/0052137 A1* | 2/2022 | Song | H01L 51/5253 |
| 2022/0123064 A1* | 4/2022 | Cao | H01L 51/52 |
| 2022/0140045 A1* | 5/2022 | Huang | H01L 27/3276 257/40 |

* cited by examiner

Providing a substrate to be etched, which includes a flexible substrate, a stack structure disposed on the flexible substrate, and a last-dry-etched metal layer disposed on a side of the stack structure away from the flexible substrate, the stack structure including an active layer, at least one conductive layer, and a plurality of insulating layers, the last-dry-etched metal layer being a last metal layer that is formed through dry etching, disposed on the flexible substrate  —S1

Forming a stretch groove by patterning the substrate to be etched, the stretch groove disposed in the stretching area and passing through the stack structure and a part of the flexible substrate  —S2

```
┌─────────────────────────────────────────────────────────────┐
│ Forming a first stretch groove portion by etching the stack │
│ structure through a first dry with the remaining part of the│──S2021
│ photoresist as a mask, the first stretch groove part passing│
│ through the stack structure                                 │
└─────────────────────────────────────────────────────────────┘
                              ▼
┌─────────────────────────────────────────────────────────────┐
│ Forming a second stretch groove portion by etching the      │
│ flexible substrate through a second dry with the stack      │──S2022
│ structure in which the first stretch groove portion as a    │
│ mask, the second stretch groove portion passing through a   │
│ part of the flexible substrate                              │
└─────────────────────────────────────────────────────────────┘
```

DISPLAY SUBSTRATE, MANUFACTURING METHOD THEREOF, DISPLAY PANEL, AND DISPLAY DEVICE

CROSS REFERENCE TO RELATED APPLICATIONS

This disclosure claims the priority of a Chinese patent application filed with National Intellectual Property Administration, P. R. C., under CN 202011249588.6, entitled "Display Substrate, Manufacturing Method Thereof, Display Panel, And Display Device" on Nov. 10, 2020, the entire contents of which are incorporated by reference in this disclosure.

TECHNICAL FIELD

Embodiments of the present disclosure relate to a display substrate, a manufacturing method thereof, a display panel, and a display device.

BACKGROUND

In order to achieve a full screen, it is a typical manner to design four sides of a display screen as curved-surface display. For further optimization, four corners of the display screen are also designed as curved-surface display. For an Organic Light-Emitting Diode (OLED) display screen, curved-surface display of arced area at the four corner regions is typically formed by stretching.

In order to improve stretching performance of the OLED substrate and prevent stretching from affecting functional film layers disposed on the flexible substrate of the OLED display screen, it is necessary to pattern a stretch area of the flexible substrate to form a stretch groove. In a method of forming a stretch groove known to the inventors, there are metal residues in the stretch groove, which may cause uneven etching of the flexible substrate and affect the stretching performance of the flexible substrate.

SUMMARY

At least one embodiment of the present disclosure provides a method of manufacturing a display substrate, the display substrate including a central display area and a stretch area located at a corner of the central display area and being arc-shaped, wherein the method includes: preparing a substrate to be etched, the substrate to be etched including a flexible substrate, a stack structure disposed on the flexible substrate, and a last-dry-etched metal layer disposed on a side of the stack structure away from the flexible substrate, the stack structure including an active layer, at least one conductive layer, and a plurality of insulating layers, wherein the last-dry-etched metal layer is a last metal layer that is formed through dry etching; and forming a stretch groove by patterning the substrate to be etched, wherein the stretch groove is disposed in the stretch area and passes through the stack structure and a part of the flexible substrate.

In an embodiment of the present disclosure, patterning the substrate to be etched includes: applying photoresist on a side of the last-dry-etched metal layer away from the stack structure; exposing and developing the photoresist to remove a portion of the photoresist located in an area to be etched; and forming the stretch groove by etching a portion of the stack structure in the area to be etched and a portion of the flexible substrate in the area to be etched through dry etching, with a remaining portion of the photoresist as a first mask.

In an embodiment of the present disclosure, the method further includes: forming an inorganic insulating protective layer on a side of the last-dry-etched metal layer away from the flexible substrate before patterning the substrate to be etched In an embodiment of the present disclosure, forming the stretch groove by etching a portion of the stack structure in the area to be etched and a portion of the flexible substrate in the area to be etched through dry etching, with a remaining portion of the photoresist as the first mask, includes: forming a first stretch groove portion passing through the stack structure by etching the stack structure through a first dry etching with the remaining portion of the photoresist as the first mask; and forming a second stretch groove portion passing through a part of the flexible substrate by etching the flexible substrate through a second dry etching with the stack structure in which the first stretch groove portion is formed as a second mask; wherein the stretch groove includes the first stretch groove portion and the second stretch groove portion, and an etching rate of the flexible substrate under conditions of the second dry etching is greater than that of the inorganic insulating protective layer under the conditions of the second dry etching.

In an embodiment of the present disclosure, preparing the substrate to be etched includes: providing a glass substrate; forming the flexible substrate on the glass substrate; forming the stack structure on a side of the flexible substrate away from the glass substrate; and forming the last-dry-etched metal layer on a side of the stack structure away from the flexible substrate.

In an embodiment of the present disclosure, the stack structure further includes a buffer layer, the conductive layer includes a first conductive layer, and the insulating layer includes a first insulating layer and a second insulating layer; forming the stack structure on the side of the flexible substrate away from the glass substrate includes: forming the buffer layer on the side of the flexible substrate away from the glass substrate; forming the active layer on a side of the buffer layer away from the flexible substrate, the active layer including a plurality of active islands; forming the first insulating layer on a side of the active layer away from the flexible substrate; forming the first conductive layer on a side of the first insulating layer away from the flexible substrate, the first conductive layer includes a plurality of gate electrodes; and forming the second insulating layer on a side of the first conductive layer away from the flexible substrate.

In an embodiment of the present disclosure, forming the last-dry-etched metal layer on the side of the stack structure away from the flexible substrate includes: forming a metal material layer on the side of the stack structure away from the flexible substrate, and forming a source-drain electrode layer by patterning the metal material layer through a dry etching, wherein the source-drain electrode layer serves as the last-dry-etched metal layer and includes a plurality of source electrodes and a plurality of drain electrodes.

In an embodiment of the present disclosure, the conductive layer further includes a second conductive layer disposed on a side of the second insulating layer away from the flexible substrate, the second conductive layer including a plurality of source electrodes and a plurality of drain electrodes, the insulating layer further includes a third insulating layer disposed on a side of the second conductive layer away from the flexible substrate; forming the last-dry-etched metal layer on the side of the stack structure away from the flexible substrate includes: forming a metal material layer on a side of the stack structure away from the flexible substrate, and forming a source-drain electrode lapping layer as the last-dry-etching metal layer by patterning the metal material layer through a dry etching, wherein the source-drain electrode lapping layer includes a plurality of lapping electrodes, each of which is electrically connected to a corresponding drain electrode of the plurality of drain electrodes via a via hole passing through the third insulating layer.

In an embodiment of the present disclosure, the display substrate further including a bonding portion configured to be bent to a side opposite to a light-emitting surface of the display substrate, and patterning the substrate to be etched further including: forming the bonding portion by etching the substrate to be etched.

At least one embodiment of the present disclosure provides a display substrate manufactured by the method as described above.

In an embodiment of the present disclosure, a resolution of the stretch area before being stretched is less than that of the central display area.

In an embodiment of the present disclosure, in a case that the stretch area is stretched, a direction of a stretching force applied to the stretch area is in a direction from a mid-point of an arc corner of the stretch area to a mid-point of an arc-shaped outer edge of the stretch area.

In an embodiment of the present disclosure, a resolution of the stretch area is increased after the display substrate is stretched.

At least one embodiment of the present disclosure provides a display panel, including a cover plate and the display substrate of claim 10, wherein the stretched area includes a display part and a non-display part located on a side of the display part away from the central display area, and a resolution of the display part is increased after the display substrate is stretched.

At least one embodiment of the present disclosure provides a display device including the display panel as described above.

The additional aspects and advantages of the present disclosure will be set forth in the following description, which will become obvious from the following description, or be understood through the practice of the present disclosure.

BRIEF DESCRIPTION OF THE DRAWINGS

The above and/or additional aspects and advantages of the present disclosure will become obvious and easy to understand from the following description of the embodiments in conjunction with the accompanying drawings, in which.

REFERENCE SIGNS

I, Display Substrate;
II, Cover Plate;
0, Glass Substrate;
T, Stretch Groove;
T1, First Stretch Groove Portion;
T2, Second Stretch Groove Portion;
10, Central Display Area;
20, Stretch Area;
30, Side Bent Area;
40, Bonding Part;
S, Source Electrode;

D, Drain Electrode;
G, Gate Electrode;
M, Lapping Electrode;
1, Flexible Substrate;
2, Stack Structure;
21, Active Layer;
211, Active Island;
22, Conductive Layer;
221, First Conductive Layer;
222, Second Conductive Layer;
23, Insulating Layer;
231, First Insulating Layer;
232, Second Insulating Layer;
233, Third Insulating Layer;
24, -Buffer Layer
3, Last-Dry-Etched Metal Layer;
4, Inorganic Insulating Protective Layer;
5, Anode Layer;
51, Anode;
6, Photoresist.

DETAILED DESCRIPTION OF THE EMBODIMENTS

The present disclosure will be described in detail below. Examples of embodiments of the present disclosure are illustrated in the accompanying drawings, in which the same or similar reference signs designate the same or similar components or components with the same or similar functions. In addition, if a detailed description of the known technology is unnecessary for illustrating feature of the present disclosure, it will be omitted. The embodiments described hereinafter with reference to the drawings are exemplary, and are only used to explain the present disclosure, and cannot be construed as a limit to the present disclosure.

One of ordinary skill in the art can understand that, unless otherwise defined, all terms (including technical and scientific terms) used herein have common meanings as those commonly understood by one of ordinary skill in the art to which this disclosure belongs. It should also be understood that terms such as those defined in general dictionaries should be understood to have a meaning consistent with the meaning in the context of the prior arts, and unless specifically defined herein, they will not be explained ideally or overly formally.

One of ordinary skill in the art can understand that, unless specifically stated, the singular forms "a", "an", " " and "the" used herein may further include plural forms. It should be further understood that the term "comprising" used in the specification of the present disclosure refers to the presence of features, integers, steps, operations, elements and/or components, but does not exclude the presence or addition of one or more other features, integers, steps, operations, elements, components, and/or groups thereof.

The inventors of the present disclosure found that in order to improve the stretching performance of the OLED substrate and prevent the stretching from affecting the functional film layer on the flexible substrate, it is necessary to form a stretch groove by patterning a stretch area of the flexible substrate. In the method of manufacturing a stretch groove known to the inventors, there are metal residues in the stretch groove, which results in uneven etching of the flexible substrate and affect the stretching performance of the flexible substrate.

Dry etching or wet etching may be used for a metal layer, while it is required to etch some metal layers of a display panel away through drying etching so as to meet requirements on precision. Thus, it is necessary to adopt dry etching even though metal residue occurs to the dry etching and there is no metal residue in the wet etching.

The embodiments of the present disclosure provide a display substrate and a manufacturing method thereof, a display panel, and a display device, so that there are no metal residues in the stretch groove.

The technical solutions of the present disclosure will be described in detail hereinafter with exemplary embodiments.

Figure 3:
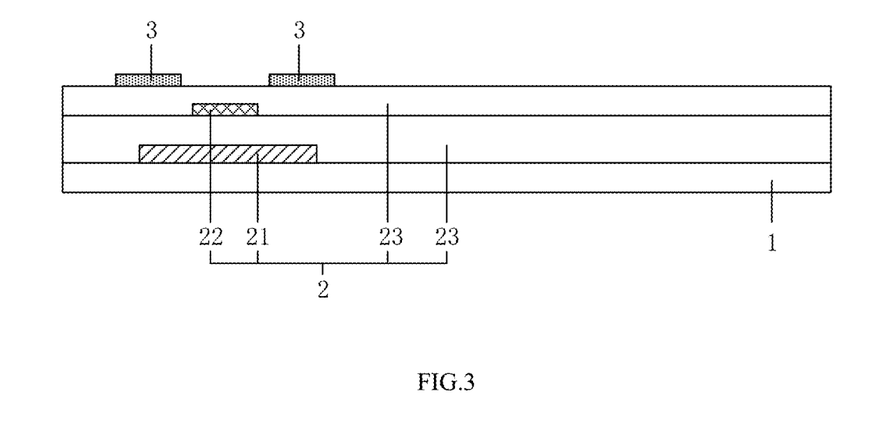
FIG. 3 illustrates a schematic process of step S1 in the method of manufacturing the display substrate illustrated in FIG. 1.

At least one embodiment of the present disclosure provides a method of manufacturing a display substrate. As illustrated in FIGS. 1 to 4, the display substrate includes a central display area 10 and a stretch areas 20 located at a corner of the central display area 10, the stretch area 20 is arc-shaped, and the method includes:

S1: A substrate to be etched is provided. The substrate to be etched includes a flexible substrate 1, a stack structure 2 disposed on the flexible substrate 1, and a last-dry-etched metal layer 3 disposed on a side of the stack structure 2 away from the flexible substrate 1. The stack structure 2 includes an active layer 21, at least one conductive layer 22, and a plurality of insulating layers 23. The last-dry-etched metal layer 3 is a last metal layer that is formed through dry etching, disposed on the flexible substrate.

It should be noted that the "last-dry-etched metal layer 3" refers to a metal layer that is furthest away from the flexible substrate and formed by dry etching, that is, the last-dry-etched metal layer 3 is a metal layer of the display substrate that is the last metal layer formed through dry etching.

Figure 4:
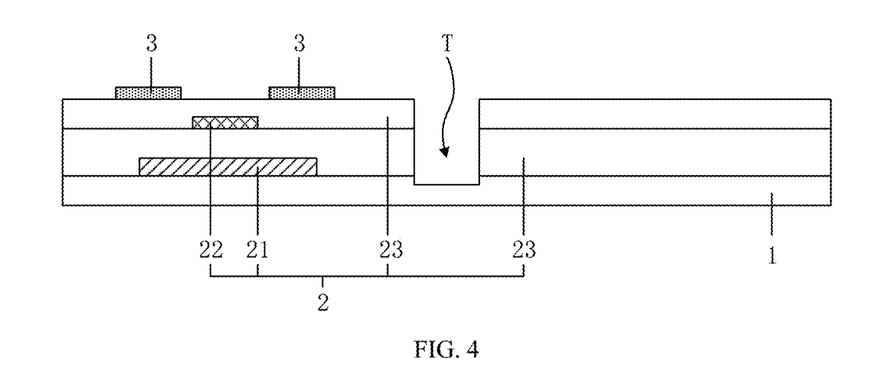
FIG. 4 illustrates a schematic process of step S2 in the method of manufacturing the display substrate illustrated in FIG. 1.
Figure 5:
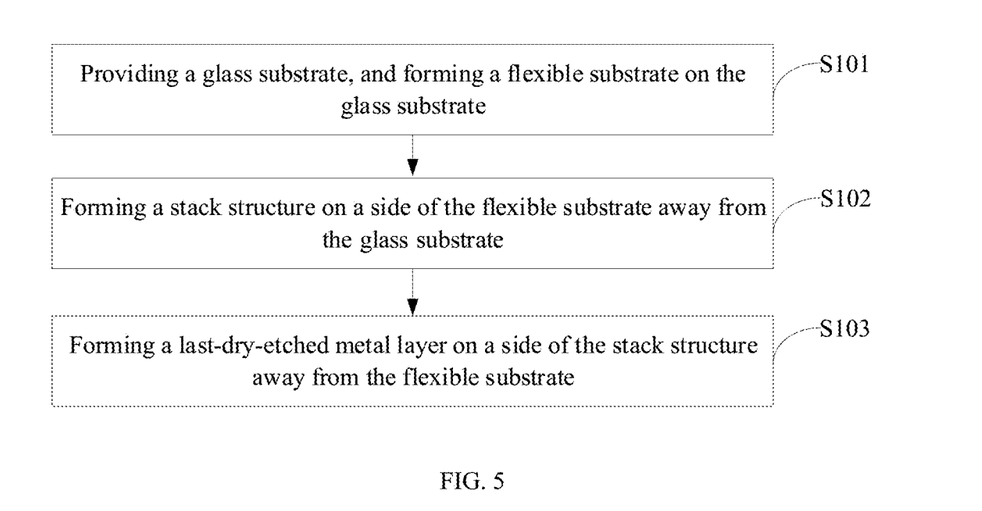
FIG. 5 illustrates a schematic flowchart of step S1 in the method of manufacturing the display substrate illustrated in FIG. 1.

S2: A stretch groove T is formed by patterning the substrate to be etched, the stretch groove disposed in the stretching area 20 and passing through the stack structure 2 and a part of the flexible substrate 1.

It should be noted that the stretch groove T passing through a part of the flexible substrate 1, which means that the stretch groove T does not completely pass through the flexible substrate 1 in a direction perpendicular to the flexible substrate 1, that is, only a part, rather than all, of the flexible substrate 1 in a direction perpendicular to the flexible substrate 1, is etched away. In a case that the display substrate is stretched, a width of the stretch groove T changes, so that the stretch groove is deformed, and the flexible substrate 1 has a relatively small thickness at the stretch groove T and is easier to be stretched, while the function film layers of the flexible substrate 1 (including the film layer in the stack structure 2 and the last-dry-etched metal layer) is almost unstretched, so as to ensure that the functional layer on the flexible substrate 1 at the non-stretch groove will not be affected by the stretch, thereby guaranteeing that the display substrate can work properly.

In the method in the embodiment of the present disclosure, the last-dry-etched metal layer 3 is formed first, and then the stack structure 2 and the flexible substrate 1 are etched to form the stretch groove, so that after the stretch groove T is formed, there is no need to etch any metal layer by dry etching, and there is no chance for any metal to enter the stretch groove. Thus, metal residues in the stretch groove T can be fundamentally avoided, thereby improving the stretching performance of the stretch area 20 of the flexible substrate 1.

Figure 1:
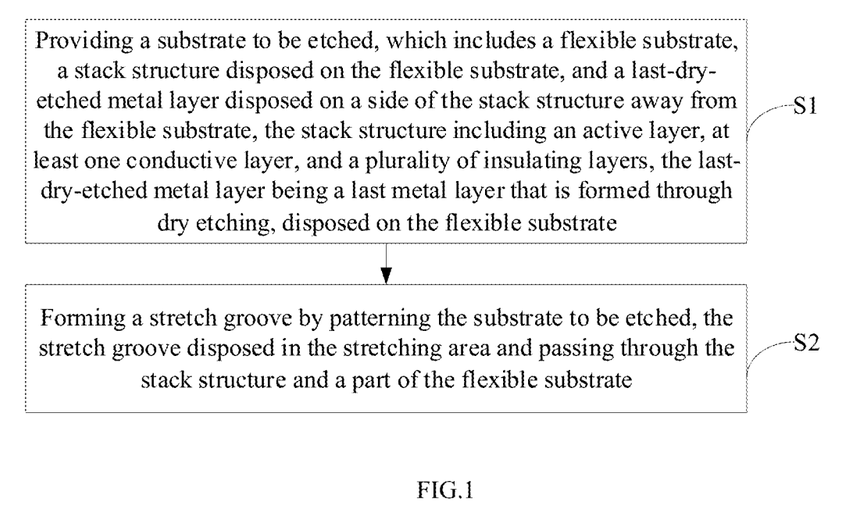
FIG. 1 illustrates a schematic flow chart of a method of manufacturing a display substrate according to an embodiment of the present disclosure.
Figure 2:
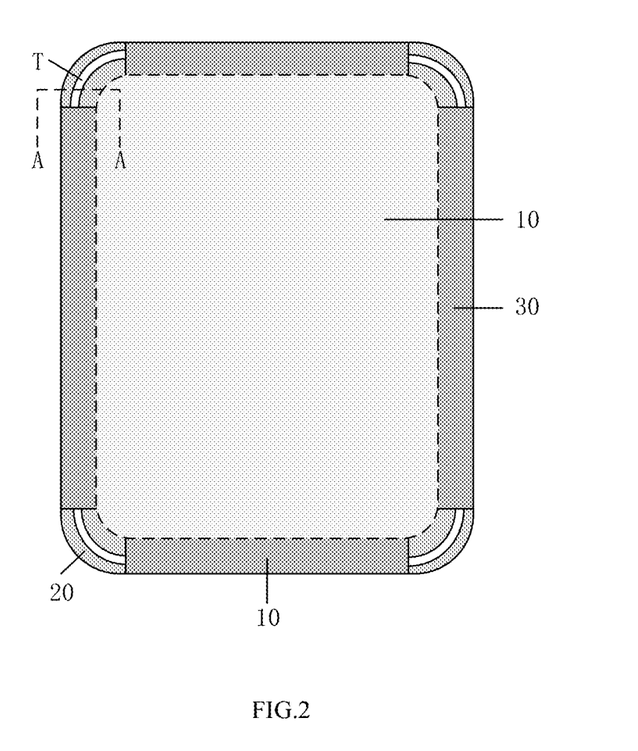
FIG. 2 illustrates a schematic top view of the structure of the display substrate manufactured by the method of manufacturing the display substrate according to an embodiment of the present disclosure.

It should be noted that although each stretch area 20 in FIG. 2 is provided with only one stretch groove T, in fact, each stretch area 20 may be provided with multiple stretch grooves T to improve the stretching performance of the stretch area.

It should be noted that the display substrate further includes side bent areas 30 located outside the four sides of the central display area 10. The side bent areas 30 and the stretch areas 10 are connected into a closed frame, and the side bent areas 30 of the display substrate are bent to a direction opposite to a light-emitting direction of the display substrate.

In an embodiment of the present disclosure, an orthographic projection of the stretch groove T on the flexible substrate 1 does not overlap orthographic projections of the active layer 21 and the conductive layer 22 on the flexible substrate 1, that is, the stretch groove T should avoid functional parts of the stack structure 2.

Figure 6:
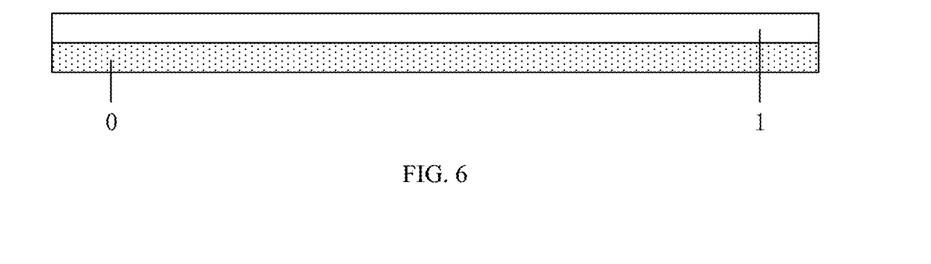
FIG. 6 illustrates a schematic process of step S101 in the method of manufacturing the display substrate illustrated in FIG. 5.

In an embodiment of the present disclosure, as illustrated in FIGS. 5 to 8, in the method of manufacturing a display substrate according to an embodiment of the present disclosure, step S1 includes:

S101: C. For example, a material of the flexible substrate 1 may be a polyimide (PI) film.

Figure 7:
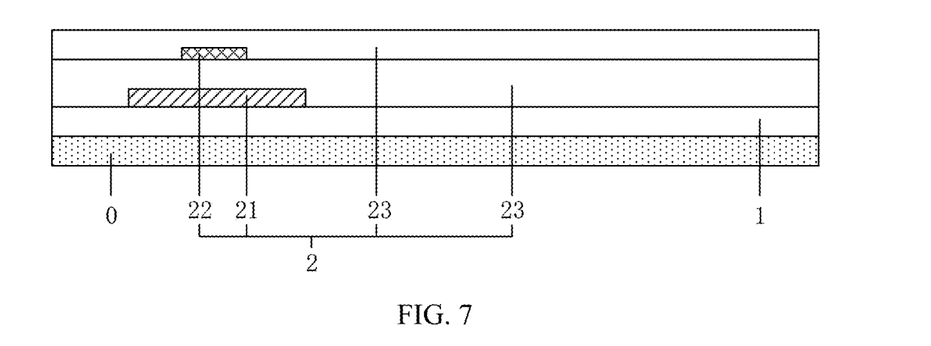
FIG. 7 illustrates a schematic process of step S102 in the method of manufacturing the display substrate illustrated in FIG. 5.

S102: A stack structure 2 is formed on a side of the flexible substrate 1 away from the glass substrate 0. According to actual designs, the stack structure 2 may include different film layers.

Figure 8:
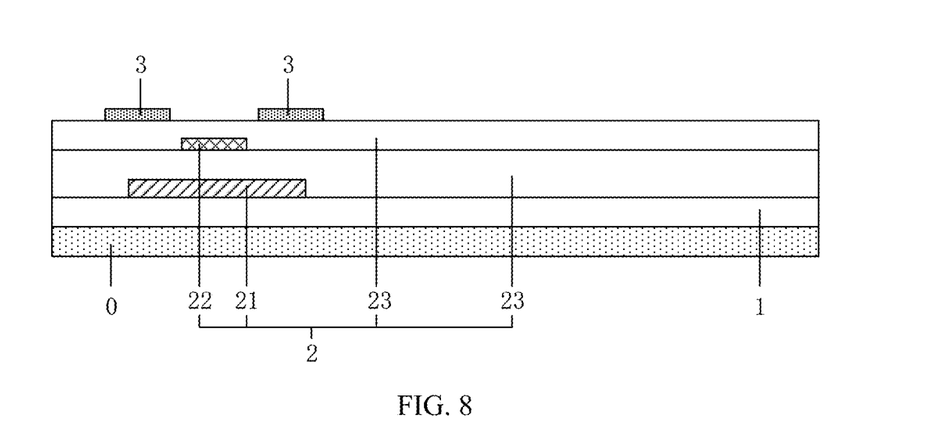
FIG. 8 illustrates a schematic process of step S103 in the method of manufacturing the display substrate illustrated in FIG. 5.
Figure 9:
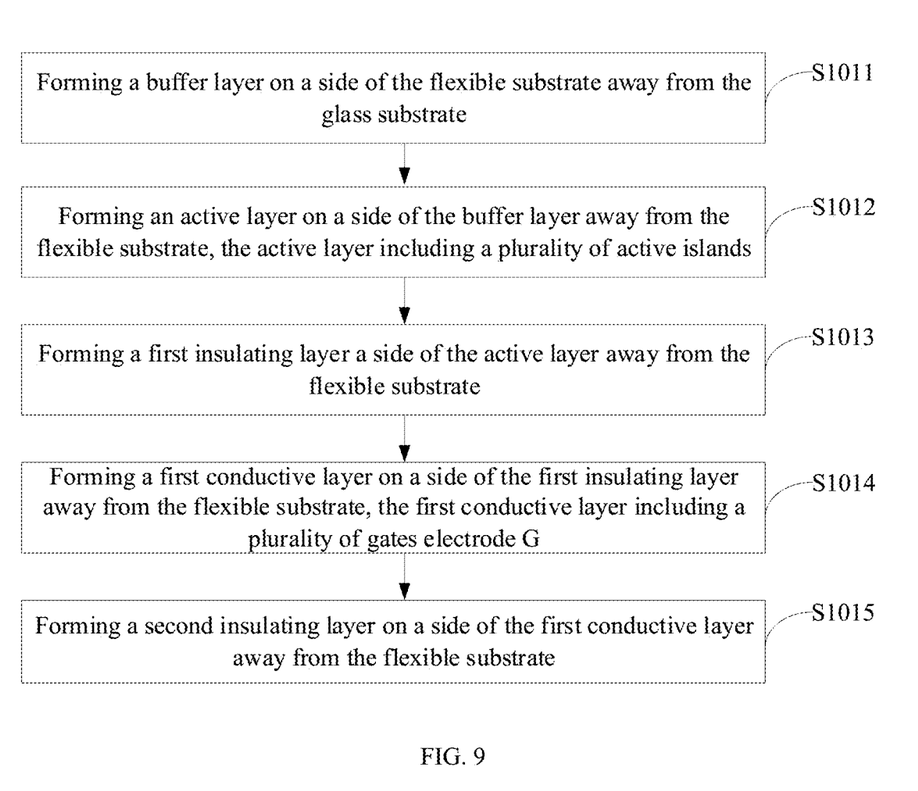
FIG. 9 illustrates a schematic flowchart of step S102 in the method of manufacturing the display substrate illustrated in FIG. 5.

S103: a last-dry-etched metal layer 3 is formed on a side of the stack structure 2 away from the flexible substrate 1.

In this embodiment, the flexible substrate 1, the stack structure 2 and the last-dry-etched metal layer 3 are sequentially formed on the glass substrate 0, that is, the last-dry-etched metal layer 3 is formed before etching the flexible substrate 1, so that a possibility of metal materials entering the drawing groove T is avoided after the stretch groove T has been etched, thereby helping to improve the stretching performance of the flexible substrate 1.

Figure 10:
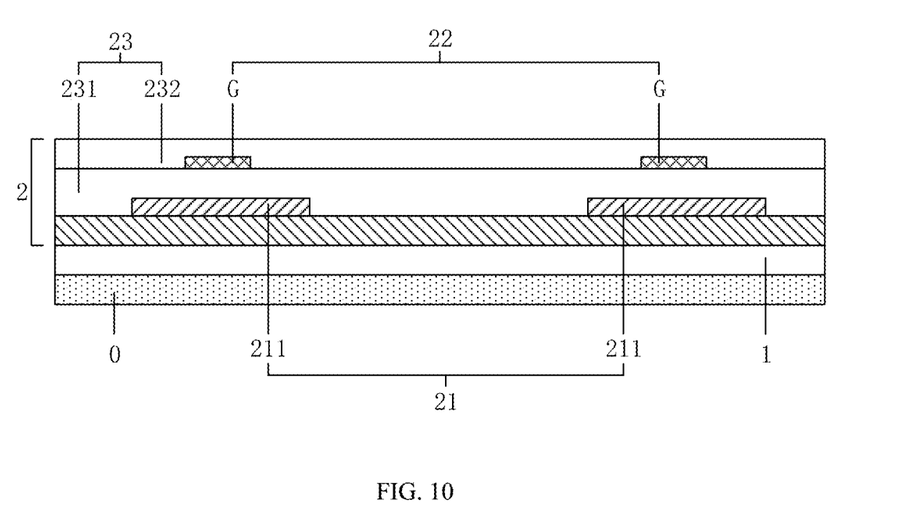
FIG. 10 illustrates a schematic structural view of the display substrate formed by step S102 before etching the stretch groove in the method of manufacturing the display substrate illustrated in FIG. 5.
Figure 11:
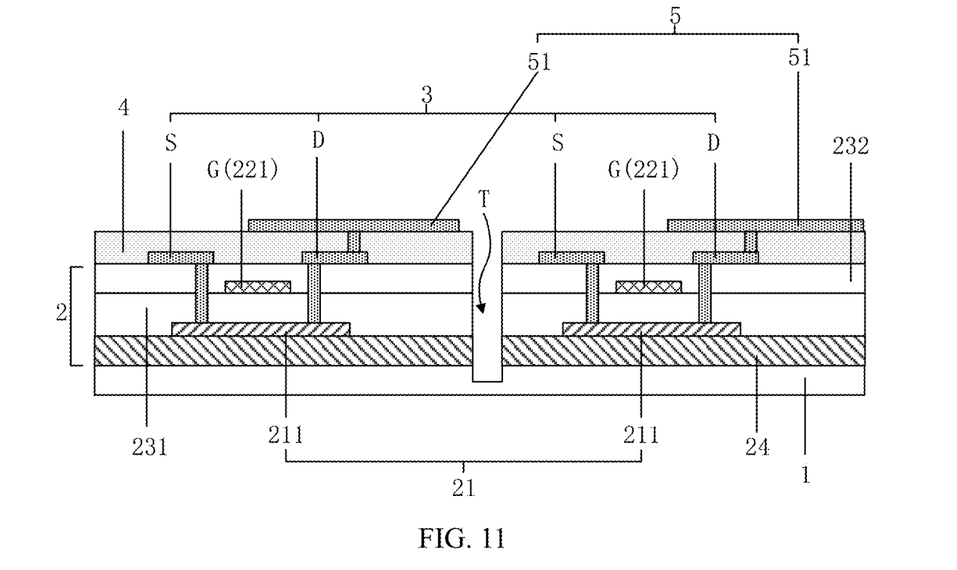
FIG. 11 illustrates a schematic cross-sectional view of the display substrate illustrated in FIG. 2 along the line A-A.

Further, in an embodiment of the present disclosure, as illustrated in FIGS. 10 and 11, the stack structure 2 further includes a buffer layer 24, the conductive layer 22 includes a first conductive layer 221, and the insulating layer 23 includes a first insulating layer 231 and a second insulating layer 232. In view of this, in the method according to the embodiment of the present disclosure, step S102 includes:

S1011: a buffer layer 24 is formed on a side of the flexible substrate 1 away from the glass substrate 0. The buffer layer 24 is beneficial to improve a bonding force between the flexible substrate 1 and the active layer 21.

S1012: An active layer 21 is formed on a side of the buffer layer 24 away from the flexible substrate 1, the active layer 21 including a plurality of active islands 211. For example, material of the active layer 21 may be polysilicon, amorphous silicon, a metal nitride semiconductor, and the like. Each of the plurality of active islands 211 includes a source region, a drain region, and a channel region disposed between the source region and the drain region.

S1013: A first insulating layer 231 is formed on a side of the active layer 21 away from the flexible substrate 1.

S1014: A first conductive layer 221 is formed on a side of the first insulating layer 231 away from the flexible substrate 1, the first conductive layer 221 including a plurality of gates electrode G. For example, an orthographic projection of each of the plurality of gate electrodes G on the flexible substrate 1 is located within an orthographic projection of a corresponding active island 211 on the flexible substrate 1, and the first conductive layer further includes a plurality of gate lines (not shown in FIG. 10), each of the plurality of gate lines is electrically connected to corresponding gates.

S1015: A second insulating layer 232 is formed on a side of the first conductive layer 221 away from the flexible substrate 1.

In an embodiment of the present disclosure, both material of the first insulating layer 231 and material of the second insulating layer 232 are inorganic insulating material.

According to various film layers included in the stack structure 2, the last-dry-etched metal layer 3 may be a different film layer, which will be described in detail below.

In an embodiment of the present disclosure, as illustrated in FIG. 11, step S103 includes:

Forming a metal material layer on a side of the stack structure 2 away from the flexible substrate 1, and forming a source-drain electrode layer by patterning the metal material layer through dry etching. The source-drain electrode layer includes a plurality of source electrodes S and a plurality of drain electrodes D, wherein the source-drain electrode layer is the last-dry-etched metal layer 3.

Figure 12:
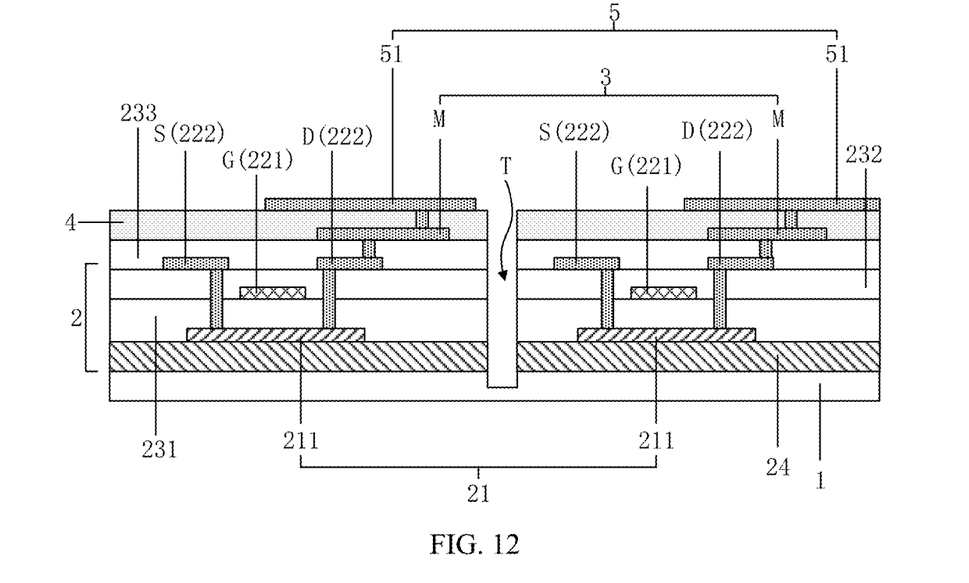
FIG. 12 illustrates another schematic cross-sectional view of the display substrate illustrated in FIG. 2 along line A-A.

In an embodiment of the present disclosure, as illustrated in FIG. 12, the conductive layer 22 further includes a second conductive layer 222 disposed on a side of the second insulating layer 232 away from the flexible substrate. The second conductive layer 222 includes a plurality of source electrodes S and a plurality of drain electrodes D, the insulating layer 23 further includes a third insulating layer 233 disposed on a side of the second conductive layer 222 away from the flexible substrate 1. Based on this, in the method according to the embodiment of the present disclosure, step S103 includes:

Forming a metal material layer on a side of the stack structure 2 away from the flexible substrate 1, and forming a source-drain electrode lapping layer by patterning the metal material layer, the source-drain electrode lapping layer being the last-dry-etched metal layer 3. The source-drain electrode lapping layer includes a plurality of lapping electrodes M, and each of the plurality of lapping electrodes M is electrically connected to a drain electrode D through a via hole passing through the third insulating layer 233.

In an embodiment of the present disclosure, the second conductive layer 222 further includes a data line, and the data line is electrically connected to a corresponding plurality of source electrodes S.

In an embodiment of the present disclosure, as illustrated in FIGS. 11 and 12, the display substrate further includes an anode layer 5 disposed on a side of the last-dry-etched metal layer 3 away from the flexible substrate 1. The anode layer 5 includes a plurality of anodes 51, and an inorganic insulating layer 4 is disposed between the anode layer 5 and the last-dry-etched metal layer 3.

In an embodiment of the present disclosure, a planarization layer is further provided between the anode layer 5 and the inorganic insulating layer 4, and the planarization layer is typically made of an organic material. In an embodiment of the present disclosure, the planarization layer is formed after forming the etching trench T.

In an embodiment of the present disclosure, as illustrated in FIGS. 11 and 12, the anode layer 5 may be formed of a metal material, but the anode layer 5 is typically wet-etched to form the plurality of anodes 51. As the anode 51 has a relatively large size, the wet etching can meet accuracy requirements of the anode layer 5, and at the same time, the wet etching will not result in metal residues.

In an embodiment of the present disclosure, the source-drain electrode layer further includes a plurality of data lines, and each of the plurality of data lines are electrically connected to a corresponding plurality of source electrodes S.

In an embodiment of the present disclosure, as illustrated in FIG. 11, each source electrode S of the source-drain electrode layer (that is, the last-dry-etched metal layer 3) is electrically connected to a source region of an active island 211, and each drain electrode D of the source-drain electrode layer is electrically connected to a drain region of an active island 211 and an anode 51 respectively.

In an embodiment of the present disclosure, as illustrated in FIG. 12, the source-drain electrode lapping layer (that is, the last-dry-etched metal layer 3) includes a plurality of lapping electrodes M, and each of the plurality of lapping electrode M is electrically connected to a drain electrode D and an anode 51 respectively, so as to achieve electrical connection between the anode 51 and the corresponding drain electrode D.

In an embodiment of the present disclosure, the gate layer may include a first gate layer and a second gate layer to increase a density of wiring. In an embodiment of the present disclosure, an insulating layer is provided between the first gate layer and the second gate layer.

Figure 13:
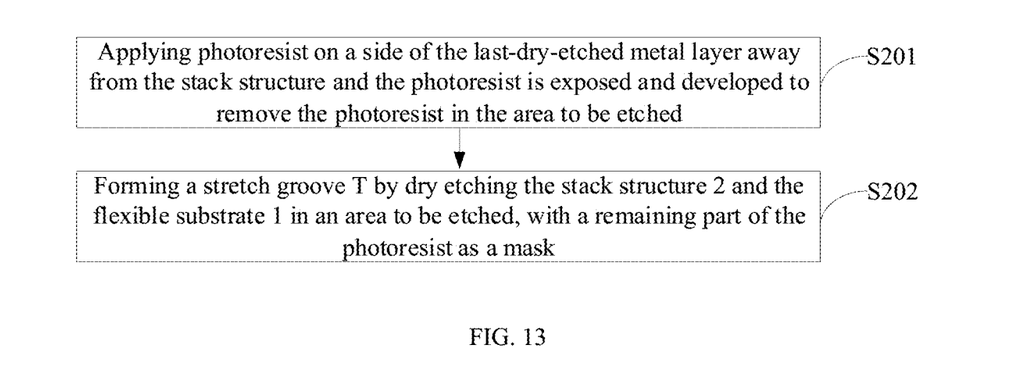
FIG. 13 illustrates a schematic flowchart of step S2 in the method of manufacturing the display substrate illustrated in FIG. 1.
Figure 14:
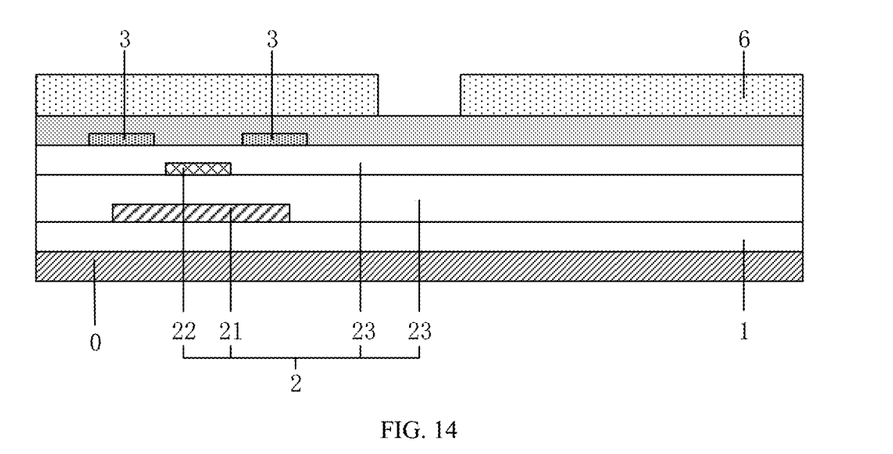
FIG. 14 illustrates a schematic process of step S201 in the method of manufacturing the display substrate illustrated in FIG. 13.
Figure 15:
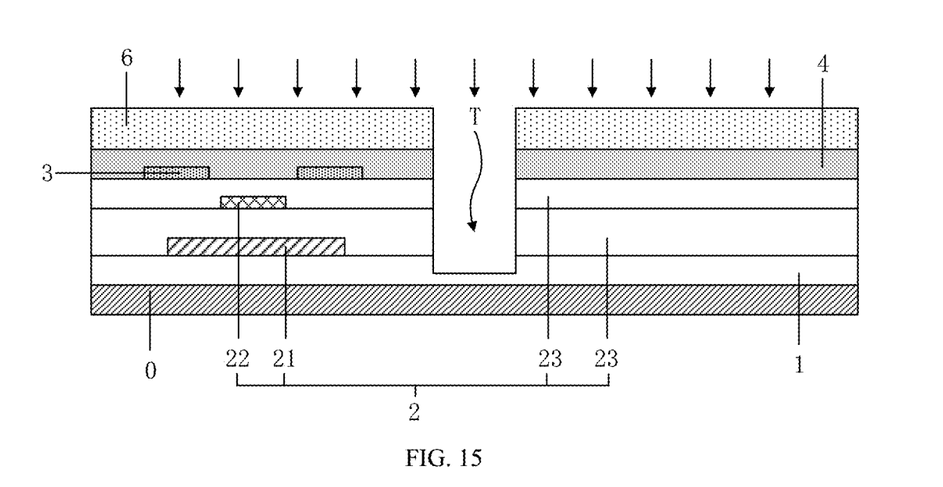
FIG. 15 illustrates a schematic process of step S202 in the method of manufacturing the display substrate illustrated in FIG. 13.

In an embodiment of the present disclosure, as illustrated in FIG. 13, FIG. 14, and FIG. 15, in the method, step S2 includes:

S201: A photoresist 6 is applied on a side of the last-dry-etched metal layer 3 away from the stack structure 2 and the photoresist 6 is exposed and developed to remove the photoresist 6 in the area to be etched. It should be noted that the photoresist 6 may be a positive photoresist or a negative photoresist.

S202: taking a remaining part of the photoresist 6 as a mask, a stretch groove T is formed by dry etching the stack structure 2 and the flexible substrate 1 in an area to be etched.

In the method according to the embodiment of the present disclosure, the stretch groove T is formed by dry etching, and a position, a shape and a size of the stretch groove T can be well controlled and the stretch groove T with a high-precision is obtained.

In an embodiment of the present disclosure, as illustrated in FIGS. 14 and 15, the method further includes: before step S2, forming an inorganic insulating protective layer 4 on a side of the last-dry-etched metal layer 3 away from the flexible substrate 1.

The term "inorganic insulating protective layer 4" refers to an inorganic insulating layer disposed between the "last-dry-etched metal layer 3" and the anode layer 5. The inorganic insulating protective layer 4 protects film layers under the inorganic insulating protective layer 4 in a subsequent process of forming the stretch groove T by etching the display substrate.

Figure 16:
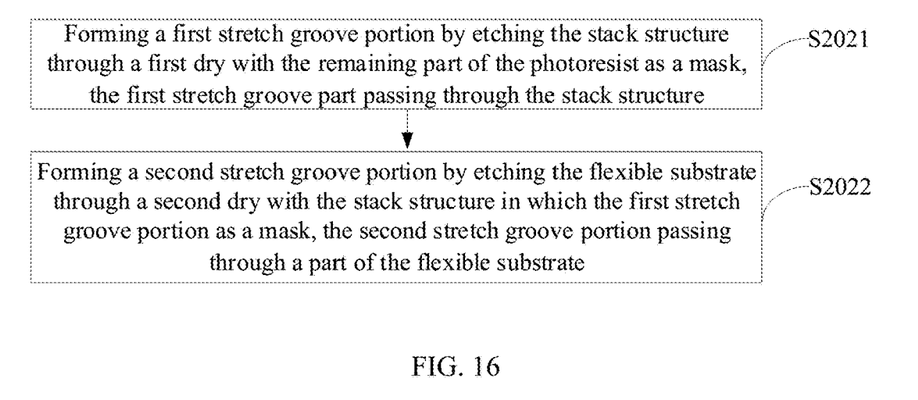
FIG. 16 illustrates a schematic flowchart of step S202 in the method of manufacturing the display substrate illustrated in FIG. 13.
Figure 17:
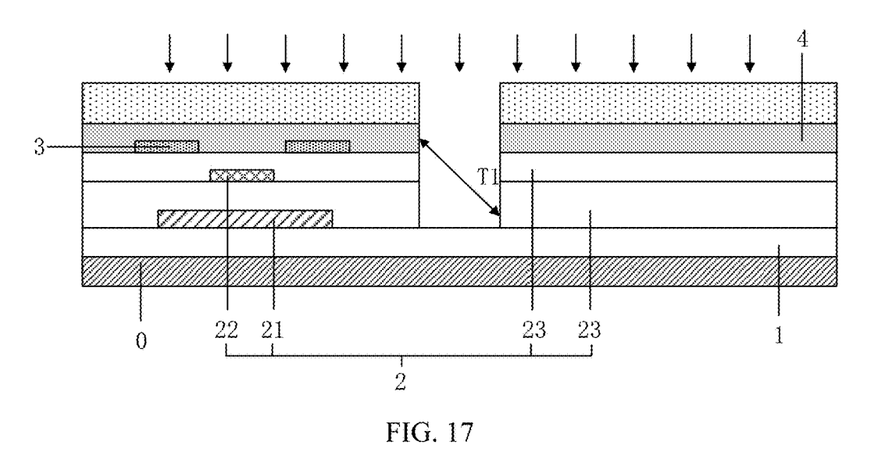
FIG. 17 illustrates a schematic the process of step S2021 in the method of manufacturing the display substrate illustrated in FIG. 16.
Figure 18:
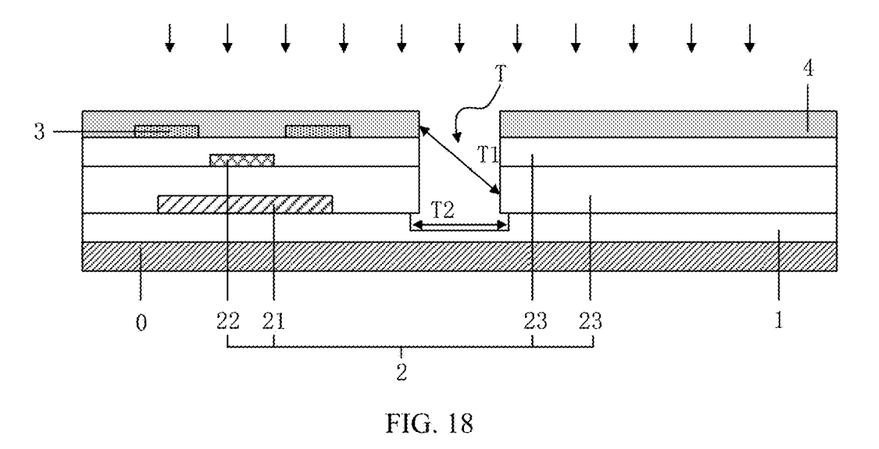
FIG. 18 illustrates a schematic process of step S2022 in the method of manufacturing the display substrate illustrated in FIG. 16.

In an embodiment of the present disclosure, as illustrated in FIG. 16, FIG. 17, and FIG. 18, in the method, step S202 includes:

S2021: taking the remaining part of the photoresist 6 as a mask, a first stretch groove portion T1 passing through the stack structure 2 by etching the stack structure 2 through a first dry etching.

In an embodiment of the present disclosure, at the time of etching the stack structure 2 through the first dry etching, some of the remaining part of the photoresist 6 is etched away due to a relatively great thickness of the stack structure 2 (including the buffer layer 21 and a plurality of inorganic insulating layers), etching parameters of the first dry etching may be adjusted such that an etching rate of inorganic material is greater than an etching rate of organic material (the photoresist 6 is made of an organic material), thereby reducing etching of the photoresist 6 as much as possible.

S2022: Taking the stack structure 2 in which the first stretch groove portion T1 is formed as a mask, a second stretch groove portion T2 passing through a part of the flexible substrate 1 is formed by etching the flexible substrate 1 through a second dry etching. The stretch groove T includes a first stretching groove portion T1 and a second stretch groove portion T2. Under conditions of the second dry etching, an etching rate of the flexible substrate 1 is greater than an etching rate of the inorganic insulating protective layer 4.

In an embodiment of the present disclosure, a gas ($O_2$) with a high selection ratio of organic material to inorganic film may be used for the second dry etching, so that the etching rate of the flexible substrate 1 is greater than the etching rate of the inorganic insulating protective layer 4, and in this process, the photoresist 6 formed of organic material can also be etched away, and no stripping operation for the photoresist is required.

Figure 19:
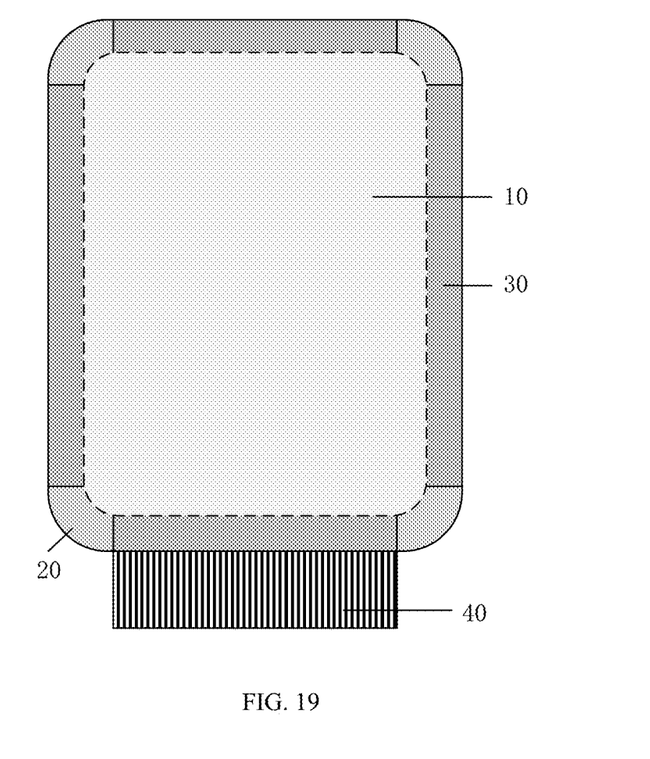
FIG. 19 illustrates a schematic top view of a display substrate manufactured by a method of manufacturing a display substrate according to another embodiment of the present disclosure.

In an embodiment of the present disclosure, as illustrated in FIG. 19, the display substrate further includes a bonding portion 40, which is operatively bent to a side opposite to the light-emitting surface of the display substrate. In the method, Step S2 further includes: forming a bonding portion 40 by etching the display substrate.

The bonding portion 40 is designed to be operatively bent to an opposite side of the light-emitting surface of the display substrate to achieve a narrow frame design of the display panel, and the bonding portion 40 and the stretch groove T can be formed in a single process, which is beneficial to simplify the process, thereby saving production cost.

Based on the same inventive concept, at least one embodiment of the present disclosure provides a display substrate. As illustrated in FIG. 2, FIG. 4, FIG. 11, FIG. 12, and FIG. 19, the display substrate is manufactured by the method of manufacturing the display substrate according to the embodiments of the present disclosure, and the display substrate has the beneficial effects of the method of manufacturing the display substrate according to the above-mentioned embodiments, and will not be elaborated herein.

In an embodiment of the present disclosure, as illustrated in FIG. 2, the stretch groove T is an arc-shaped groove. Before stretching the stretch area 20, a resolution of the stretch area 20 is less than that of the display zone 10.

Figure 20:
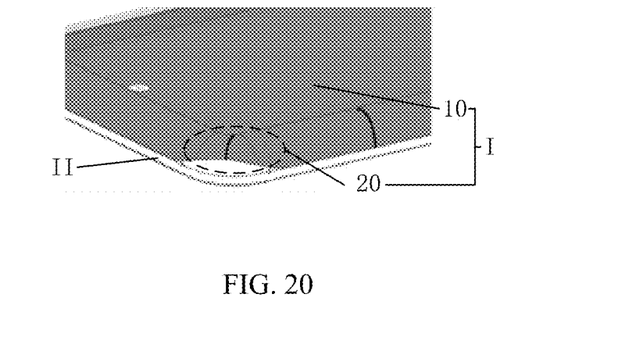
FIG. 20 illustrates a schematic structural view of a display panel according to an embodiment of the present disclosure.
Figure 21:
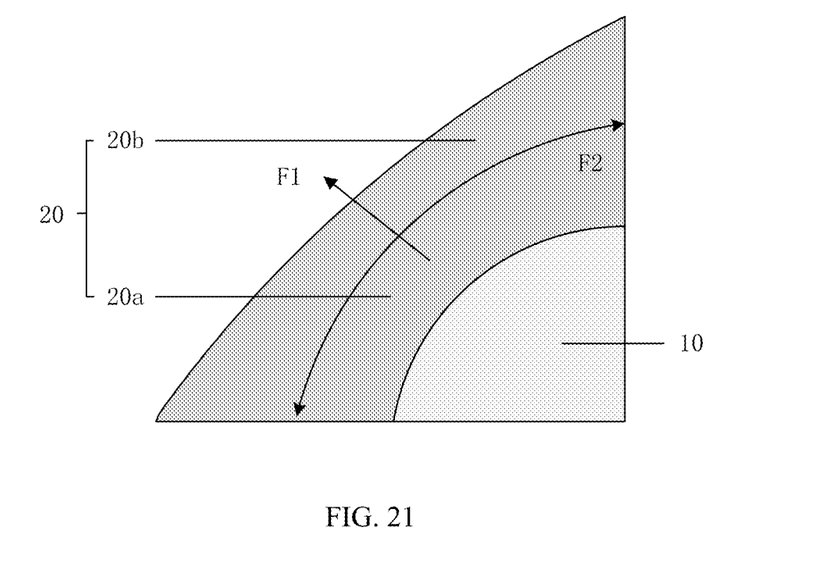
FIG. 21 is a schematic view illustrating the display substrate being stretched according to an embodiment of the present disclosure.

Based on the same inventive concept, at least one embodiment of the present disclosure provides a display panel, as illustrated in FIGS. 20 and 21, and in conjunction with FIGS. 2 and 19, a display panel according to an embodiment of the present disclosure includes a cover plate II and the display substrate I as described in the embodiments, the stretch area 20 includes a display portion 20*a* and a non-display portion 20*b* disposed on a side of the display portion 20*a* far away from the display area 10. After the display substrate is stretched, a resolution of the display portion 20*a* is increased. The display panel according to the embodiment of the present disclosure includes the display substrate 1 in the above-mentioned embodiment, and has the beneficial effects of the display substrate 1 as described in the above-mentioned embodiments, which will not be elaborated here.

In an embodiment of the present disclosure, as illustrated in FIG. 21, in a case that the stretch area 20 of the display substrate is stretched, a stretching force F1 is applied to the stretch area 20 of the display substrate, and a direction of the stretching force F1 is determined by a direction from a midpoint of an arc-shaped corner of the display area 10 to a midpoint of an arc-shaped outer edge of the stretching area 20. At this time, a bending force F2 is generated in the stretch area 20 of the display substrate, and the bending force F2 has a component oriented toward the central display area 10, such that a portion of the stretch 20 is contracted. Accordingly, the pixel density in this portion of the stretched area 20 will be increased, that is, the resolution of this portion of the stretched area 20 is increased. For example, the portion of the stretched area 20 whose resolution is increased can be designed as a display portion 20a, and the resolution of the non-display portion 20b will not affect the display even if it is decreased.

In an embodiment of the present disclosure, by designing pixel arrangement and stretching parameters of the stretch area 20, the resolution of the display portion 20a after being increased and the resolution of the central display area 10 tend to consistent with each other, thereby improving the display effect of the display panel.

Figure 22:
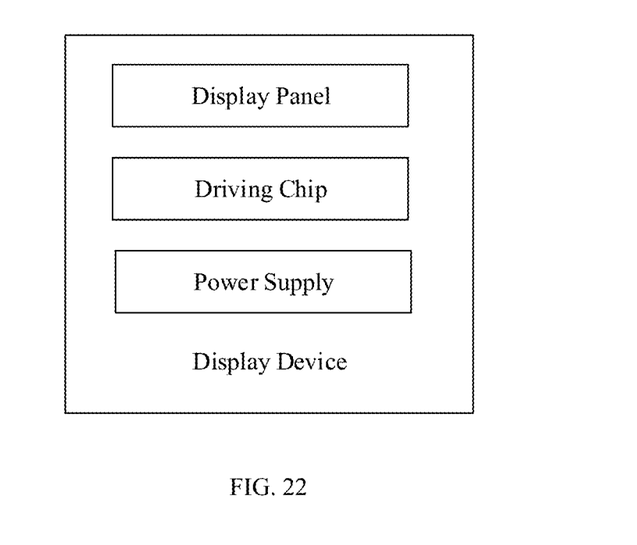
FIG. 22 illustrates a schematic block diagram of a display device according to an embodiment of the present disclosure.

Based on the same inventive concept, at least one embodiment of the present disclosure provides a display device. As illustrated in FIG. 22, the display device includes the display panel as described in the embodiments and has the beneficial effects of the display panel according to the above-mentioned embodiments, which is not elaborated here.

In an embodiment of the present disclosure, the display device further includes a driving chip and a power supply, the driving chip provides driving signals for the display panel, and the power supply provides electric power for the display panel.

In an embodiment of the present disclosure, the display device is a display device with arc shapes at four corners, such as a mobile phone or a tablet computer.

According to the display substrate and the manufacturing method thereof, the display panel, and the display device according to the embodiments of the present disclosure, the last-dry-etched metal layer is first formed, and then, the stretch groove is formed by etching the stack structure and the flexible substrate, such that there is no metal layer to be etched through a dry etching after forming the stretch groove, this is, there is no chance for metal residues to enter the stretch groove. Therefore, metal residue in the stretch groove can be fundamentally avoided, thereby improving the stretching performance of the flexible substrate in the stretch area.

One of ordinary skill in the art can understand that various operations, methods, and steps, measures, and solutions in the process that have been discussed in the present disclosure can be alternated, changed, combined, or deleted. Further, other steps, measures, and solutions of various operations, methods, and processes that have been discussed in detail in the present disclosure can also be alternated, changed, rearranged, decomposed, combined, or deleted. Further, various steps, measures, and solutions of the art may be combined with various steps, measures, and solutions in the various operations, methods, and procedures disclosed in the present disclosure.

In the description of the present disclosure, it should be understood that orientations or positional relationships indicated by the terms "center", "upper", "lower", "front", "rear", "left", "right", "vertical", "horizontal", "top", "bottom", "inner", "outer", etc. is based on the orientations or positional relationships as illustrated in the drawings, and is just for the convenience of describing the present disclosure and simplifying the description, rather than indicating or implying that the referred device or element must have a specific orientation, be configured and operated in a specific orientation, and therefore cannot be construed as a limit to the present disclosure.

The terms "first" and "second" are only used for descriptive purposes, and cannot be understood as indicating or implying relative importance or implicitly indicating the number of indicated technical features. Thus, the features defined with "first" and "second" may explicitly or implicitly include one or more of these features. In the description of the present disclosure, unless otherwise specified, "plurality" means two or more than two.

In the description of the present disclosure, it should be noted that, unless otherwise clearly specified or limited, the terms "installed", "connected", and "linked" should be interpreted broadly. For example, it may refer to a fixed connection, detachable connection, or an integrated connection; or it may refer to a direct connection or an indirect connection through an intermediate medium, or it may refer to an internal communication between two components. For one of ordinary skill in the art, the specific meanings of the above-mentioned terms in the present disclosure can be understood according to the context.

In the description of the present disclosure, exact features, structures, materials or characteristics can be combined in any one or more embodiments or examples in any suitable manner.

It should be understood that although the various steps in the flowchart of the drawings are displayed in sequence as indicated by the arrows, these steps are not necessarily performed in sequence in the order indicated by the arrows. Unless explicitly stated in the present disclosure, these steps are not performed in a strict order, and they can be performed in other orders. Moreover, at least part of the steps in the flowchart of the drawings may include multiple sub-steps or multiple stages. These sub-steps or stages are not necessarily executed at the same time, but mat be executed at different times, and are not necessarily performed in sequence, and they may be performed in turn or alternately with at least a part of other steps or sub-steps or stages of other steps.

The above are only part of the embodiments of the present disclosure. It should be understood by one of ordinary skill in the art that various variations and modifications can be made to the embodiments of the present disclosure with departing the principle of the present disclosure, and these variations and modifications should also be considered within the protection scope of this disclosure.

The invention claimed is:

1. A method of manufacturing a display substrate, the display substrate comprising a central display area and a stretch area located at a corner of the central display area and being arc-shaped, wherein the method comprises:
preparing a substrate to be etched, the substrate to be etched comprising a flexible substrate, a stack structure disposed on the flexible substrate, and a last-dry-etched metal layer disposed on a side of the stack structure away from the flexible substrate, the stack structure comprising an active layer, at least one conductive layer, and a plurality of insulating layers, wherein the last-dry-etched metal layer is a last metal layer that is formed through dry etching; and
forming a stretch groove by patterning the substrate to be etched, wherein the stretch groove is disposed in the stretch area and passes through the stack structure and a part of the flexible substrate;
wherein patterning the substrate to be etched comprises:
applying photoresist on a side of the last-dry-etched metal layer away from the stack structure;
exposing and developing the photoresist to remove a portion of the photoresist located in an area to be etched; and
forming the stretch groove by etching a portion of the stack structure in the area to be etched and a portion of the flexible substrate in the area to be etched through dry etching, with a remaining portion of the photoresist as a first mask;

wherein the display substrate further comprises a bonding portion configured to be bent to a side opposite to a light-emitting surface of the display substrate, and patterning the substrate to be etched further comprises: forming the bonding portion by etching the substrate to be etched.

2. The method according to claim 1, further comprising: forming an inorganic insulating protective layer on a side of the last-dry-etched metal layer away from the flexible substrate before patterning the substrate to be etched.

3. The method according to claim 2, wherein forming the stretch groove by etching a portion of the stack structure in the area to be etched and a portion of the flexible substrate in the area to be etched through dry etching, with a remaining portion of the photoresist as the first mask, comprising:

forming a first stretch groove portion passing through the stack structure by etching the stack structure through a first dry etching with the remaining portion of the photoresist as the first mask; and forming a second stretch groove portion passing through a part of the flexible substrate by etching the flexible substrate through a second dry etching with the stack structure in which the first stretch groove portion is formed as a second mask;

wherein the stretch groove comprises the first stretch groove portion and the second stretch groove portion, and an etching rate of the flexible substrate under conditions of the second dry etching is greater than that of the inorganic insulating protective layer under the conditions of the second dry etching.

4. The method according to claim 1, wherein preparing the substrate to be etched comprises:

providing a glass substrate;

forming the flexible substrate on the glass substrate;

forming the stack structure on a side of the flexible substrate away from the glass substrate; and forming the last-dry-etched metal layer on a side of the stack structure away from the flexible substrate.

5. The method according to claim 4, wherein the stack structure further comprises a buffer layer, the conductive layer comprises a first conductive layer, and the insulating layer comprises a first insulating layer and a second insulating layer; forming the stack structure on the side of the flexible substrate away from the glass substrate comprises:

forming the buffer layer on the side of the flexible substrate away from the glass substrate;

forming the active layer on a side of the buffer layer away from the flexible substrate, the active layer including a plurality of active islands;

forming the first insulating layer on a side of the active layer away from the flexible substrate;

forming the first conductive layer on a side of the first insulating layer away from the flexible substrate, the first conductive layer comprises a plurality of gate electrodes; and forming the second insulating layer on a side of the first conductive layer away from the flexible substrate.

6. The method according to claim 5, wherein forming the last-dry-etched metal layer on the side of the stack structure away from the flexible substrate comprises: forming a metal material layer on the side of the stack structure away from the flexible substrate, and forming a source-drain electrode layer by patterning the metal material layer through a dry etching, wherein the source-drain electrode layer serves as the last-dry-etched metal layer and comprises a plurality of source electrodes and a plurality of drain electrodes.

7. The method according to claim 5, wherein the conductive layer further comprises a second conductive layer disposed on a side of the second insulating layer away from the flexible substrate, the second conductive layer comprises a plurality of source electrodes and a plurality of drain electrodes, and the insulating layer further comprises a third insulating layer disposed on a side of the second conductive layer away from the flexible substrate;

forming the last-dry-etched metal layer on the side of the stack structure away from the flexible substrate comprises: forming a metal material layer on a side of the stack structure away from the flexible substrate, and forming a source-drain electrode lapping layer as the last-dry-etching metal layer by patterning the metal material layer through a dry etching, wherein the source-drain electrode lapping layer comprises a plurality of lapping electrodes, each of which is electrically connected to a corresponding drain electrode of the plurality of drain electrodes via a via hole passing through the third insulating layer.

8. A display substrate, manufactured by the method according to claim 1.

9. The display substrate according to claim 8, wherein a resolution of the stretch area before being stretched is less than that of the central display area.

10. The display substrate according to claim 8, wherein, in a case that the stretch area is stretched, a direction of a stretching force applied to the stretch area is in a direction from a mid-point of an arc corner of the stretch area to a mid-point of an arc-shaped outer edge of the stretch area.

11. The display substrate according to claim 8, wherein a resolution of the stretch area is increased after the display substrate is stretched.

12. A display panel, comprising a cover plate and the display substrate according to claim 8, wherein the stretched area comprises a display part and a non-display part located on a side of the display part away from the central display area, and a resolution of the display part is increased after the display substrate is stretched.

13. A display device, comprising the display panel according to claim 12.

* * * * *